United States Patent
Yoo et al.

(10) Patent No.: US 9,214,401 B2
(45) Date of Patent: Dec. 15, 2015

(54) DISPLAY SUBSTRATE, METHOD OF MANUFACTURING THE SAME AND DISPLAY APPARATUS HAVING THE SAME

(71) Applicant: Samsung Display Co., LTD., Yongin, Gyeonggi-Do (KR)

(72) Inventors: Dong-Hyun Yoo, Hwaseong-si (KR); Seong-Young Lee, Hwaseong-si (KR); Jae-Won Kim, Asan-si (KR); Hyung-Jun Park, Seongnam-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 44 days.

(21) Appl. No.: 14/312,912

(22) Filed: Jun. 24, 2014

(65) Prior Publication Data
US 2015/0200145 A1    Jul. 16, 2015

(30) Foreign Application Priority Data

Jan. 13, 2014    (KR) .................. 10-2014-0003792

(51) Int. Cl.
*G02F 1/13* (2006.01)
*H01L 21/66* (2006.01)
*H01L 27/12* (2006.01)
*H01L 21/3213* (2006.01)
*G02F 1/1368* (2006.01)
*G02F 1/1362* (2006.01)

(52) U.S. Cl.
CPC .............. *H01L 22/32* (2013.01); *G02F 1/1309* (2013.01); *G02F 1/1368* (2013.01); *G02F 1/136259* (2013.01); *G02F 1/136286* (2013.01); *H01L 21/32133* (2013.01); *H01L 27/124* (2013.01); *H01L 27/1259* (2013.01); *G02F 2001/136254* (2013.01)

(58) Field of Classification Search
CPC ........................ G02F 1/136259; G02F 1/1309
See application file for complete search history.

(56) References Cited

U.S. PATENT DOCUMENTS

| | | | |
|---|---|---|---|
| 7,365,825 B2 | 4/2008 | Kim | |
| 8,193,826 B2 | 6/2012 | Lee | |
| 8,502,227 B2 | 8/2013 | Yoshida et al. | |

FOREIGN PATENT DOCUMENTS

| | | |
|---|---|---|
| JP | 2011-164361 A | 8/2011 |
| KR | 10-0692691 B1 | 3/2007 |
| KR | 1020080048161 A | 6/2008 |
| KR | 10-1102020 B1 | 1/2012 |

*Primary Examiner* — Phu Vu
(74) *Attorney, Agent, or Firm* — Cantor Colburn LLP (57) ABSTRACT

A display substrate includes a base substrate including a display area and a peripheral area surrounding the display area, a switching element in the display area, a main-test-line in the peripheral area, extending in the second direction and electrically connected with a data line, a sub-test-line in the peripheral area, and a test pad in the peripheral area and electrically connected with the main-test-line and the sub-test-line. The switching element is electrically connected with a gate line extending in a first direction and the data line extending in a second direction crossing the first direction. The sub-test-line is electrically connected with the data line. The sub-test-line is in a different layer from the main-test-line.

20 Claims, 10 Drawing Sheets

DISPLAY SUBSTRATE, METHOD OF MANUFACTURING THE SAME AND DISPLAY APPARATUS HAVING THE SAME

This application claims priority to Korean Patent Application No. 10-2014-0003792, filed on Jan. 13, 2014, and all the benefits accruing therefrom under 35 U.S.C. §119, the contents of which are herein incorporated by reference in their entireties.

BACKGROUND

1. Field

The invention relates to a display substrate, method of manufacturing the display substrate and a display apparatus having the display substrate. More particularly, the invention relates to a display substrate including a test line to which a contact is applied to test the display substrate, method of manufacturing the display substrate and a display apparatus having the display substrate.

2. Description of the Related Art

A liquid display apparatus having relatively light weight and small size has been manufactured. A cathode ray tube ("CRT") display apparatus has been used due to a performance and a competitive price. However the CRT display apparatus has a weakness with a size or portability thereof. Therefore, the liquid display apparatus has been highly regarded due to a relatively small size, light weight and low-power-consumption of the liquid display apparatus.

A process of manufacturing the liquid display apparatus may include substrate rinsing, substrate patterning, forming an alignment layer, rubbing of the alignment layer, combining of substrates, injecting of liquid crystal, mounting, testing, repairing and the like.

SUMMARY

A testing process of a display apparatus may include an electrical lighting test and/or a defect test of each pixel within the display apparatus, which is performed after signal lines and pixels of the display apparatus are formed on a substrate. In the process of testing the display apparatus, a test line is applied with a contact in order to check a disconnection of a line or a point defect within the display apparatus. However, when the contact is applied to the test line, the test line may be damaged.

One or more exemplary embodiment of the invention provides a display substrate including a test line to which a contact is applied to test the display substrate.

One or more exemplary embodiment of the invention also provides a method of manufacturing the display substrate, and a display apparatus having the display substrate.

In an exemplary embodiment of a display substrate according to the invention, the display substrate includes a base substrate including a display area and a peripheral area surrounding the display area, a gate line extending in a first direction and a data line extending in a second direction crossing the first direction, a switching element in the display area, a main-test-line in the peripheral area, extending in the second direction and electrically connected with the data line, a sub-test-line in the peripheral area, and a test pad electrically connected with the main-test-line and the sub-test-line. The switching element is electrically connected with the gate line and the data line. The sub-test-line is electrically connected with the data line. The sub-test-line is in a different layer from the main-test-line.

In an exemplary embodiment, the main-test-line and the gate line may be in a same layer.

In an exemplary embodiment, the sub-test-line and the data line may be in a same layer.

In an exemplary embodiment, the sub-test-line may overlap the main-test-line.

In an exemplary embodiment, the display substrate may further include a connecting electrode connecting the main-test-line and the sub-test-line to each other.

In an exemplary embodiment, the switching element may include a gate electrode electrically connected with the gate line, a source electrode electrically connected with the data line and a drain electrode spaced apart from the source electrode.

In an exemplary embodiment, the display substrate may further include a pixel electrode electrically connected with the drain electrode. The connecting electrode and the pixel electrode may be in a same layer.

In an exemplary embodiment of a display apparatus according to the invention, the display apparatus includes a first substrate and a second substrate. The first substrate includes a base substrate including a display area and a peripheral area surrounding the display area, a gate line extending in a first direction and a data line extending in a second direction crossing the first direction, a switching element in the display area, a main-test-line in the peripheral area, extending in the second direction and electrically connected with the data line, a sub-test-line in the peripheral area, and a test pad electrically connected with the main-test-line and the sub-test-line. The switching element is electrically connected with the gate line and the data line. The sub-test-line is electrically connected with the data line. The sub-test-line is in a different layer from the main-test-line. The second substrate includes a second base substrate facing the first base substrate and a common electrode on the second base substrate.

In an exemplary embodiment, the main-test-line and the gate line may be in a same layer.

In an exemplary embodiment, the sub-test-line and the data line may be in a same layer.

In an exemplary embodiment, the sub-test-line may overlap the main-test-line.

In an exemplary embodiment, the display apparatus may further include a liquid crystal layer between the first substrate and the second substrate.

In an exemplary embodiment, the switching element may include a gate electrode electrically connected with the gate line, a source electrode electrically connected with the data line and a drain electrode spaced apart from the source electrode.

In an exemplary embodiment, the display apparatus may further include a pixel electrode electrically connected with the drain electrode.

In an exemplary embodiment, the display apparatus may further include an alignment layer on the pixel electrode and configured to align a liquid crystal molecule of the liquid crystal layer.

In an exemplary embodiment, the pixel electrode may include a transparent conductive material.

In an exemplary embodiment, the connecting electrode and the pixel electrode may be in a same layer.

In an exemplary embodiment of a method of manufacturing a display apparatus according to the invention, the method includes forming a first conductive layer on a base substrate, forming a gate metal pattern including a gate line and a main-test-line by patterning the first conductive layer, forming a second conductive layer on a base substrate on which the gate metal pattern is formed and forming a data metal pattern including a data line and a sub-test-line by patterning the second conductive layer.

In an exemplary embodiment, the method may further include forming a transparent conductive layer on the base substrate on which the data metal pattern is formed and forming a connecting electrode connecting the main-test-line and the sub-test-line line by patterning the transparent conductive layer.

According to one or more exemplary embodiment of the invention as explained above, the test line includes a main-test-line including a gate metal layer and a sub-test-line including a data metal layer. In addition, sub-test-line overlaps the main-test-line and is exposed to outside a display substrate in a manufacturing process. Thus, a defect of a data line may be tested by contacting the exposed sub-test-line.

In addition, a defect test is performed by contacting the exposed sub-test-line of the test line, so that an accurate result may be obtained. In addition, although the sub-test-line may be damaged by a contact thereto, the un-exposed main-test-line is not damaged. Thus, a quality of a display apparatus including the display substrate may be improved.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

Figure 1:
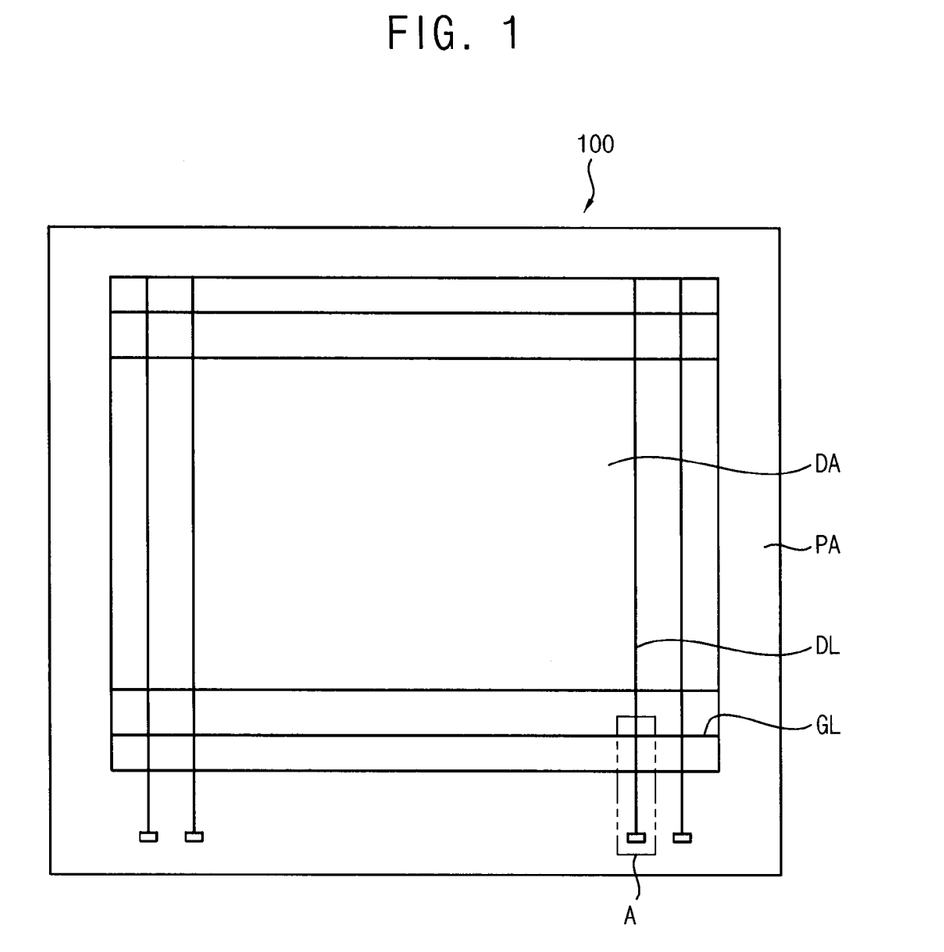
FIG. 1 is a plan view illustrating an exemplary embodiment of display substrate according to the invention.
Figure 2:
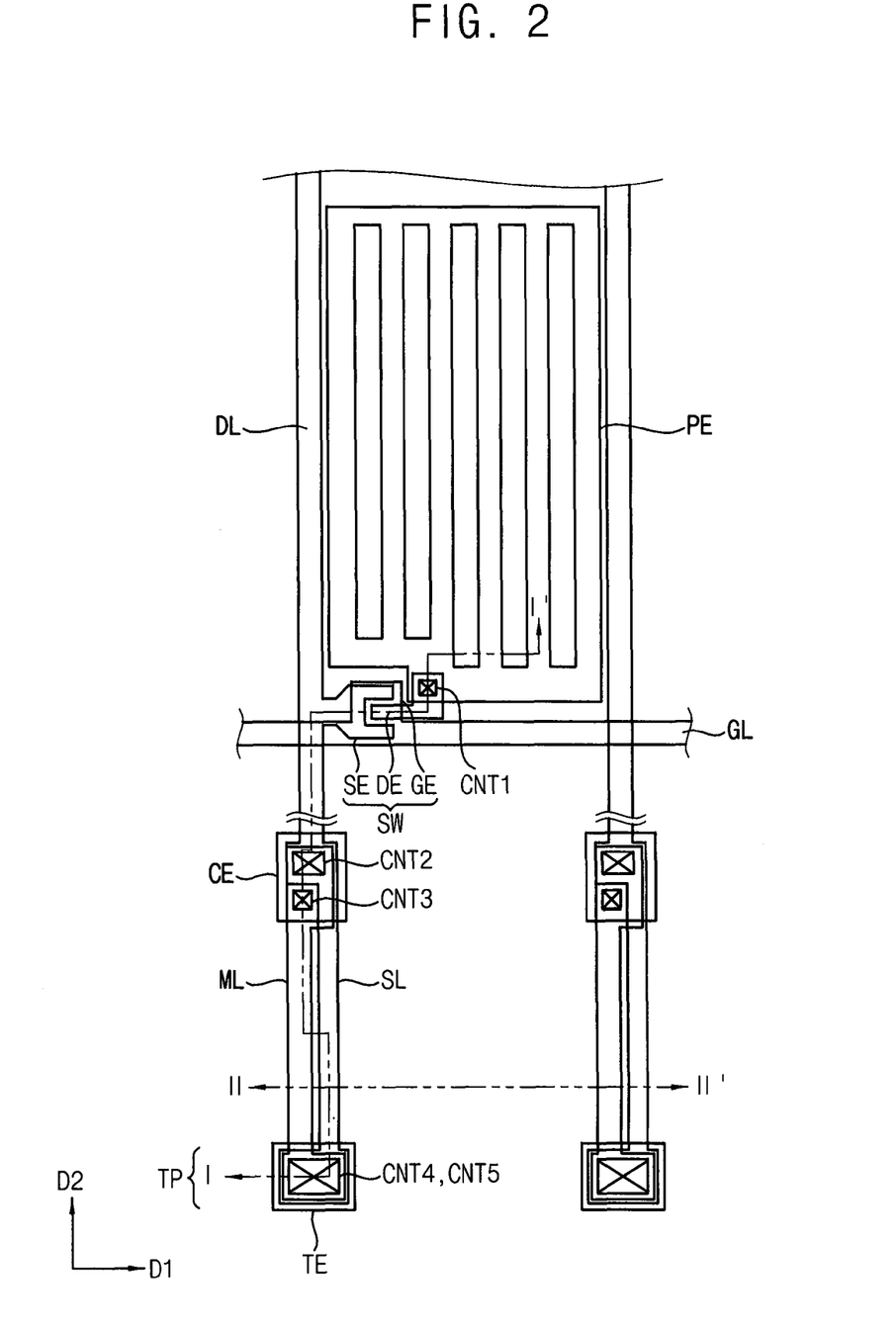
FIG. 2 is an enlarged plan view of portion "A" of FIG. 1.
Figure 3:
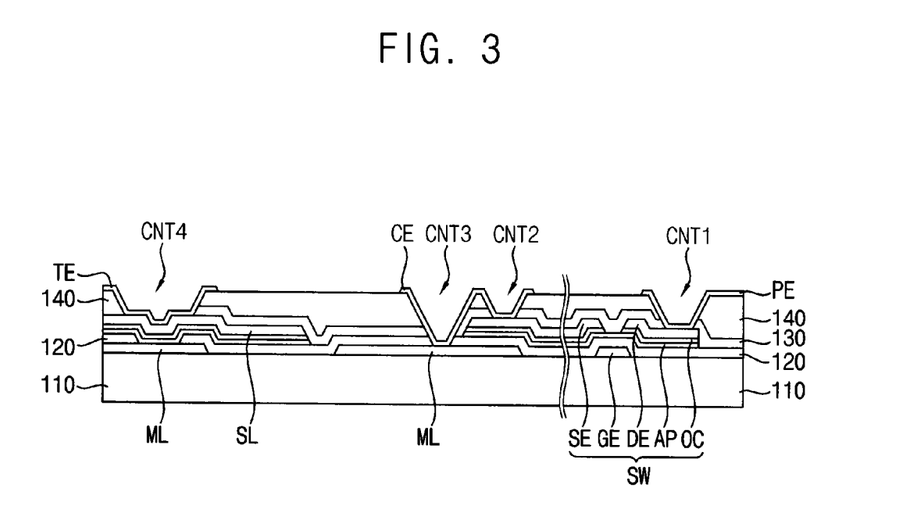
FIG. 3 is a cross-sectional view taken along line I-I' of FIG. 2.
Figure 4:
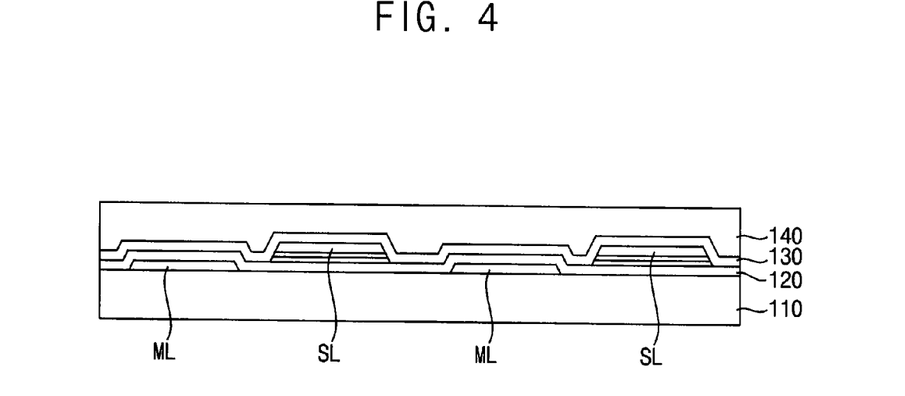
FIG. 4 is a cross-sectional view taken along line II-II' of FIG. 2.

FIG. 1 is a plan view illustrating an exemplary embodiment of display substrate according to the invention. FIG. 2 is an enlarged plan view of portion "A" of FIG. 1. FIG. 3 is a cross-sectional view taken along line I-I' of FIG. 2. FIG. 4 is a cross-sectional view taken along line II-II' of FIG. 2.

Referring to FIGS. 1 to 4, a display substrate 100 includes a display area DA, and a peripheral area PA surrounding the display area DA. In an exemplary embodiment, for example, the display substrate 100 may include a lower substrate of a liquid crystal display apparatus.

The display area DA includes a plurality of data lines DL, a plurality of gate lines GL, a plurality of switching elements SW and a plurality of pixel electrodes PE. The data lines DL are arranged in a first direction D1. The data line DL extends in a second direction D2 crossing the first direction D1. The gate lines GL are arranged in the second direction D2. The gate line GL extends in the first direction D1. Each of the switching elements SW is electrically connected to a gate line GL and a data line DL among the plurality of gate lines GL and data lines DL. Each of the pixel electrodes PE is electrically connected to a switching element SW among the plurality of switching elements SW.

A test pad TP connected with a data line DL disposed in the display area DA is used to test the data line DL and is disposed in the peripheral area PA. A test line connecting the data line DL and the test pad TP to each other is disposed in the peripheral area PA. The test line may include a main-test-line ML and a sub-test-line SL.

In addition, a flexible pad part (not shown), a circuit mounted part (not shown), etc. of a display apparatus may be disposed in the peripheral area PA.

The flexible pad part includes a plurality of driving pads electrically connected to terminals of flexible printed circuit boards. The driving pads receive drive signals for driving the display substrate 100. In an exemplary embodiment, for example, the driving pads receive data drive signals for driving a driving integrated circuit ("IC") mounted on the circuit mounted part, and gate drive signals for driving a gate driving circuit. The data drive signal may include analog power signals, logic power signals, a data signal, a clock signal, a gamma signal, a carry signal and the like. The gate drive signal may include a gate clock signal, a gate power signal and the like.

The circuit mounted part includes the driving ICs mounted thereon. The circuit mounted part includes input and output pads. The input and output pads are connected to input terminal and output terminals of the driving IC through a conductive adhesive member. The input and output pads include an input pad connected to an input terminal of the driving IC to output the drive signal for driving the driving IC and an output pad connected to an output terminal of the driving IC to receive an output signal of the driving IC.

The display substrate 100 further includes a base substrate 110, a gate electrode GE, source electrode SE, a drain electrode DE, a semiconductor layer AP, an ohmic contact layer OC, a pixel electrode PE, a gate insulation layer 120, a first passivation layer 130, an organic layer 140, the main-test-line ML, the sub-test-line SL, a connecting electrode CE, the test pad TP and a pad electrode TE.

Examples of the base substrate 110 may include a glass substrate, a quartz substrate, a silicon substrate, a plastic substrate or the like.

The gate electrode GE is disposed on the base substrate 110. The gate electrode GE may have a single layer structure including copper (Cu), silver (Ag), chrome (Cr), molybdenum (Mo), aluminum (Al), titanium (Ti), manganese (Mn) or a combination thereof. In addition, the gate electrode GE may have a multi-layer structure having a plurality of layers including different materials. In an exemplary embodiment, for example, the gate electrode GE may include an upper layer of copper, and a lower layer of titanium layer on the upper layer.

The gate insulation layer 120 is disposed on the gate electrode GE. The gate insulation layer 120 may cover the base substrate 110 and a first conductive pattern including the gate electrode GE. The gate insulation layer 120 may include an inorganic material such as silicon oxide (SiOx) and/or silicon nitride (SiNx). In an exemplary embodiment, for example, the gate insulation layer 120 includes silicon oxide (SiOx), and may have a cross-sectional thickness of about 500 angstroms (Å). In addition, the gate insulation layer 120 may have a multi-layer structure including a plurality of layers including different materials from each other.

An active pattern is disposed on the gate insulation layer 120. The active pattern is disposed on the gate insulation layer 120 in an area in which the gate electrode GE is disposed. The active pattern may be overlapped with the gate electrode GE. The active pattern may be partially overlapped with the source electrode SE and the drain electrode DE. The active pattern may be disposed between the gate electrode GE and the source electrode SE. The active pattern may be disposed between the gate electrode GE and the drain electrode DE.

The active pattern may include the semiconductor layer AP and the ohmic contact layer OC. The ohmic contact layer OC is disposed on the semiconductor layer AP. The semiconductor layer AP may include a silicon semiconductor material. In an exemplary embodiment, for example, the semiconductor layer AP may include amorphous silicon (a-Si:H). The ohmic contact layer OC may be interposed between the semiconductor layer AP and the source electrode SE, and may be interposed between the semiconductor layer AP and the drain electrode DE. The ohmic contact layer OC may include n+ amorphous silicon (n+ a-Si:H).

The source electrode SE and the drain electrode DE may be disposed on the active pattern. The source electrode SE and the drain electrode DE may be spaced apart from each other.

The source electrode SE and the drain electrode DE may have a single layer structure including copper (Cu), silver (Ag), chrome (Cr), molybdenum (Mo), aluminum (Al), titanium (Ti), manganese (Mn) or a combination thereof. In addition, the source electrode SE and the drain electrode DE may have a multi-layer structure including a plurality of layers including materials different each other. In an exemplary embodiment, for example, the source electrode SE and the drain electrode DE may include a copper layer, and a titanium layer disposed on and/or under the copper layer.

The first passivation layer 130 may be disposed on the source electrode SE and the drain electrode DE. The first passivation layer 130 may include a material such as silicon oxide (SiOx) or silicon nitride (SiNx).

The organic layer 140 is disposed on the passivation layer 130. The organic layer 140 planarizes an upper surface of the display substrate 100 so that problems due to a step difference between layers of the display substrate, such as disconnection of a signal line, may be reduced or effectively prevented. The organic layer 140 may be an insulation layer including an organic material.

The pixel electrode PE is disposed on the organic layer 140. The pixel electrode PE may include a transparent conductive material, such as indium tin oxide ("ITO") and indium zinc oxide ("IZO"). In addition, the pixel electrode PE may include titanium (Ti) and/or molybdenum titanium (MoTi). The pixel electrode PE may be electrically connected with the drain electrode DE. The pixel electrode PE may be electrically connected with the drain electrode DE through a first contact hole CNT1.

The main-test-line ML extends in the second direction D2. The main-test-line ML may be in a same layer as the gate line GL and the gate electrode GE. In addition, the main-test-line ML may include the same material as the gate line GL and the gate electrode GE.

In an exemplary embodiment, for example, the main-test-line ML may have a single layer structure including copper (Cu), silver (Ag), chrome (Cr), molybdenum (Mo), aluminum (Al), titanium (Ti), manganese (Mn) or a combination thereof. In addition, the main-test-line ML may have a multi-layer structure including a plurality of layers including different materials. In an exemplary embodiment, for example, the main-test-line ML may include an upper layer of copper, and a lower layer of titanium layer on the upper layer.

The sub-test-line SL extends in the second direction D2. The sub-test-line SL may be in a same layer as the data line DL, the source electrode SE and the drain electrode DE. In addition, the sub-test-line SL may include the same material as the data line DL, the source electrode SE and the drain electrode DE.

In an exemplary embodiment, for example, the sub-test-line SL may have a single layer structure including copper (Cu), silver (Ag), chrome (Cr), molybdenum (Mo), aluminum (Al), titanium (Ti), manganese (Mn) or a combination thereof. In addition, the sub-test-line SL may have a multi-layer structure including a plurality of layers including different materials. In an exemplary embodiment, for example, the sub-test-line SL may include an upper layer of copper, and a lower layer of titanium layer on the upper layer.

The main-test-line ML and the sub-test-line SL are electrically connected with the data line DL.

The main-test-line ML and the sub-test-line SL are electrically connected to each other and to the data line DL by a connecting electrode CE. The connecting electrode CE may be electrically connected with the sub-test-line SL through a second contact hole CNT2. The connecting electrode CE may be electrically connected with the main-test-line ML through a third contact hole CNT3. Thus, connecting electrode CE may connect the main-test-line ML and the sub-test-line SL through the second contact hole CNT2 and the third contact hole CNT3, respectively.

The connecting electrode CE may be in a same layer as the pixel electrode PE. In addition, the connecting electrode CE may include a transparent conductive material such as ITO and IZO. In addition, the connecting electrode CE may include titanium (Ti) and/or molybdenum titanium (MoTi).

The test pad TP includes the pad electrode TE. The sub-test-line SL may be electrically connected with the main-test-line ML through a fifth contact hole CNT5. In addition, the pad electrode TE may be electrically connected with the sub-test-line SL through a fourth contact hole CNT4. Thus, pad electrode TE may be electrically connected with the main-test-line ML and the sub-test-line SL. A test signal may be applied to the test pad TP. Thus, an open state and a shorted state of the data line DL may be tested by using the test signal applied to the test pad TP.

In an exemplary embodiment of manufacturing a display apparatus, after the data line DL, the source electrode SE and the drain electrode DE are formed, an open state and a shorted state of the data line DL may be tested. A test of an open and a short state of the data line DL may include one method in which a contact is applied to a test line and another method in which a contact is not applied to a test line. As used herein, a contact indicates a physical contact to the test line. A method in which a contact is applied to a test line may damage or impair the test line, but a method in which a contact is applied to the test line may be accurate. However, a method in which a contact is not applied to a test line may not damage or impair the test line, but a method in which a contact is not applied to the test line may be inaccurate.

One or more exemplary embodiment of the display substrate 100 according to the invention includes a test line having a multi-layer structure, such as including a double layer structure. The test line includes a main-test-line ML and a sub-test-line SL in different layers than each other. When a test is performed by contacting the test line, the sub-test-line SL is contacted with a tester. Thus, the sub-test-line SL may be damaged by the contacting of the tester. However, the main-test-line ML is not contacted with the tester, so that the main-test-line ML is not damaged. Thus, an accurate test may be performed without damage of the test line.

FIGS. 5 to 17 are cross-sectional views illustrating an exemplary embodiment of a method of manufacturing the display substrate of FIGS. 3 and 4.

Figure 5:
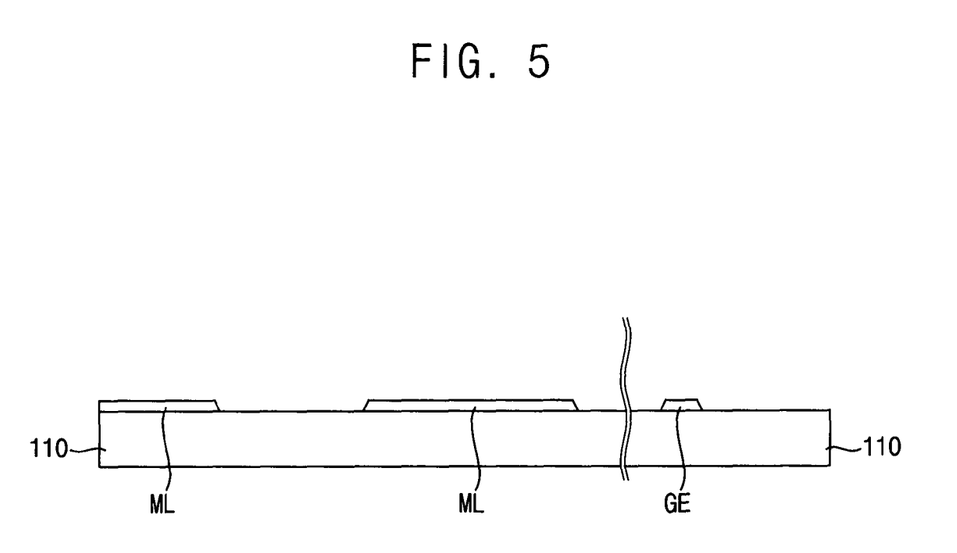
FIGS. 5 to 17 are cross-sectional views illustrating an exemplary embodiment of a method of manufacturing the display substrate of FIGS. 3 and 4.

Referring to FIG. 5 taken along line I-I' of FIG. 2, a gate electrode GE and a main-test-line ML is formed on a base substrate 110.

Examples of the base substrate 110 may include a glass substrate, a quartz substrate, a silicon substrate, a plastic substrate or the like.

The gate electrode GE and the main-test-line ML may be formed by patterning a first conductive layer. The first conductive layer may be formed through a sputtering process. The first conductive layer may have a single layer structure including copper (Cu), silver (Ag), chrome (Cr), molybdenum (Mo), aluminum (Al), titanium (Ti), manganese (Mn) or a combination thereof. In addition, the first conductive layer may have a multi-layer structure including a plurality of layers including materials different each other. The first conductive layer may be a gate metal layer. In addition, the gate electrode GE and the main-test-line ML may be a gate metal pattern. The main-test-line ML and the gate electrode GE may be formed from a same layer and in a same layer of the display substrate. The main-test-line ML and the gate electrode GE may include the same material.

Figure 6:
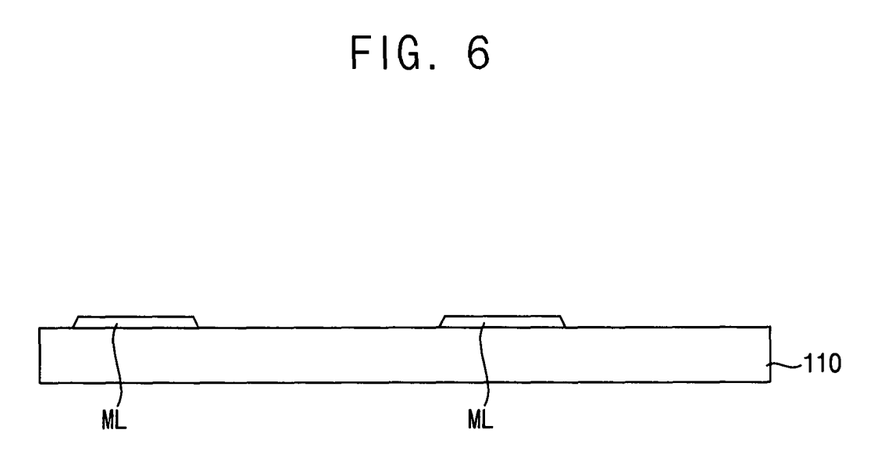

Referring to FIG. 6 taken along line II-II' of FIG. 2, the main-test-line ML is formed on the base substrate 110. A plurality of main-test-lines ML may be formed on the base substrate 110. The main-test-lines ML may be extended parallel to each other. The main-test-line ML may be formed by patterning the first conductive layer. The first conductive layer may be formed through a sputtering process. The first conductive layer may have a single layer structure including copper (Cu), silver (Ag), chrome (Cr), molybdenum (Mo), aluminum (Al), titanium (Ti), manganese (Mn) or a combination thereof. In addition, the first conductive layer may have a multi-layer structure including a plurality of layers including materials different each other. The first conductive layer may be the gate metal layer. The main-test-line ML and the gate electrode GE may be formed from a same layer and in a same layer of the display substrate. The main-test-line ML and the gate electrode GE may include the same material.

Figure 7:
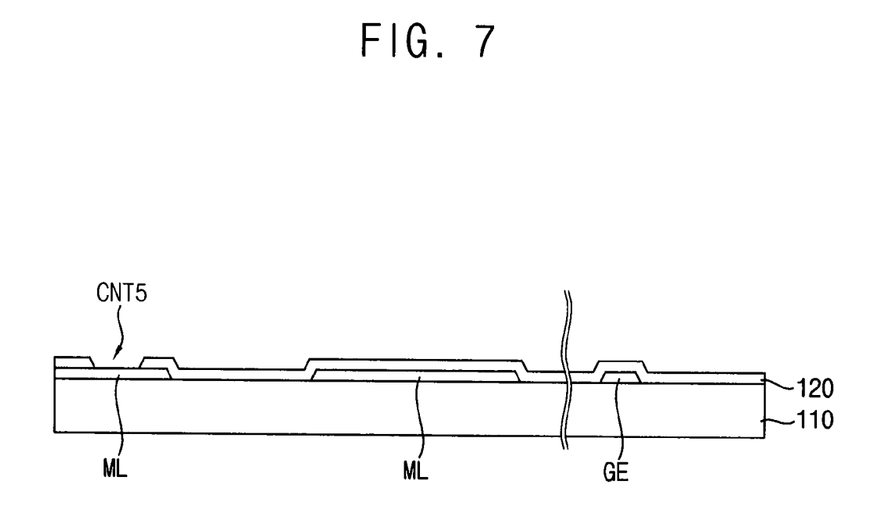

Referring to FIG. 7 taken along line I-I' of FIG. 2, agate insulation layer 120 is formed on base substrate 110 including the gate electrode GE and the main-test-line ML thereon. The gate insulation layer 120 may include an inorganic material such as silicon oxide (SiOx) and/or silicon nitride (SiNx). In an exemplary embodiment, for example, the gate insulation layer 120 includes silicon oxide (SiOx), and may have a thickness of about 500 Å. In addition, the gate insulation layer 120 may include a plurality of layers including different materials from each other.

A fifth contact hole CNT5 is formed in the gate insulation layer 120. A test pad (TP of FIG. 2) is formed at an end (e.g., a distal end) of the main-test-line ML. The main-test-line ML may be electrically connected with the sub-test-line (SL of FIG. 2) in the test pad TP. The main-test-line ML may be electrically connected with the sub-test-line (SL of FIG. 2) through the fifth contact hole CNT5.

Figure 8:
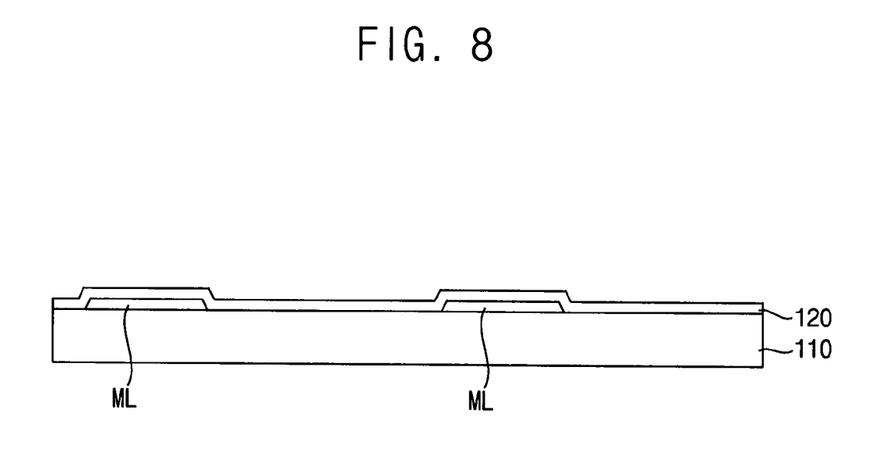

Referring to FIG. 8 taken along line II-II' of FIG. 2, the gate insulation layer 120 is formed on base substrate 110 including the main-test-line ML thereon. The gate insulation layer 120 may include an inorganic material such as silicon oxide (SiOx) and/or silicon nitride (SiNx). In an exemplary embodiment, for example, the gate insulation layer 120 includes silicon oxide (SiOx), and may have a thickness of about 500 Å. In addition, the gate insulation layer 120 may include a plurality of layers including different materials from each other.

Figure 9:
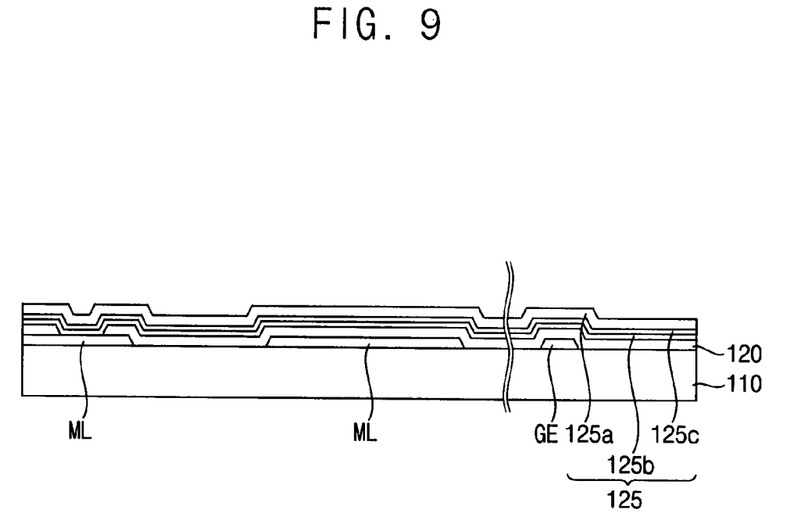

Referring to FIG. 9 taken along line I-I' of FIG. 2, a second conductive layer 125 may be formed on the base substrate 110 including the gate insulation layer 120 thereon. The second conductive layer 125 may include a data metal layer 125a, a semiconductor layer 125b and an ohmic contact layer 125c. The data metal layer 125a may form the source electrode SE and the drain electrode DE in the display area DA. The data metal layer 125a may form the sub-test-line in the peripheral area PA. The semiconductor layer 125b may include amorphous silicon (a-Si:H). The ohmic contact layer 125c may be interposed between the semiconductor layer 125b and the source electrode SE, and may be interposed between the semiconductor layer 125b and the drain electrode DE. The ohmic contact layer 125c may include n+ amorphous silicon (n+ a-Si:H).

Figure 10:
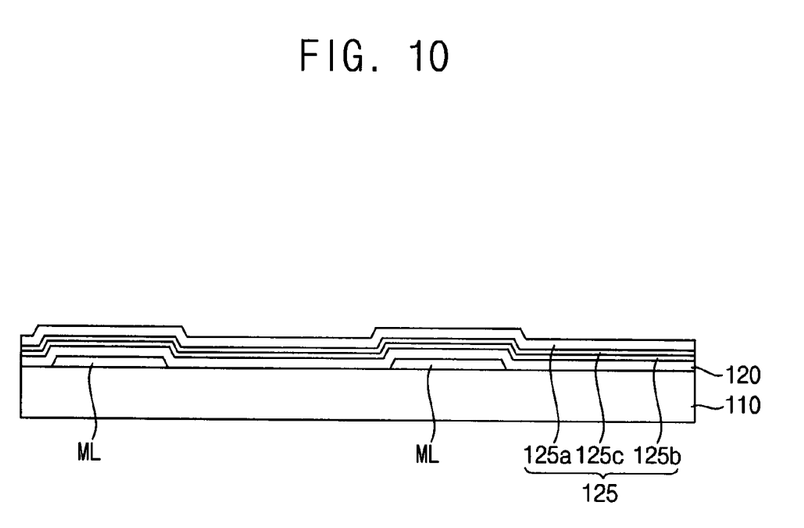

Referring to FIG. 10 taken along line II-II' of FIG. 2, the second conductive layer 125 may be formed on the base substrate 110 including the gate insulation layer 120 thereon. The second conductive layer 125 may include the data metal layer 125a, the semiconductor layer 125b and the ohmic contact layer 125c. The data metal layer 125a may form the sub-test-line in the peripheral area PA. The semiconductor layer 125b may include amorphous silicon (a-Si:H). The ohmic contact layer 125c may be interposed between the semiconductor layer 125b and the source electrode SE, and may be interposed between the semiconductor layer 125b and the drain electrode DE. The ohmic contact layer 125c may include n+ amorphous silicon (n+ a-Si:H).

Figure 11:
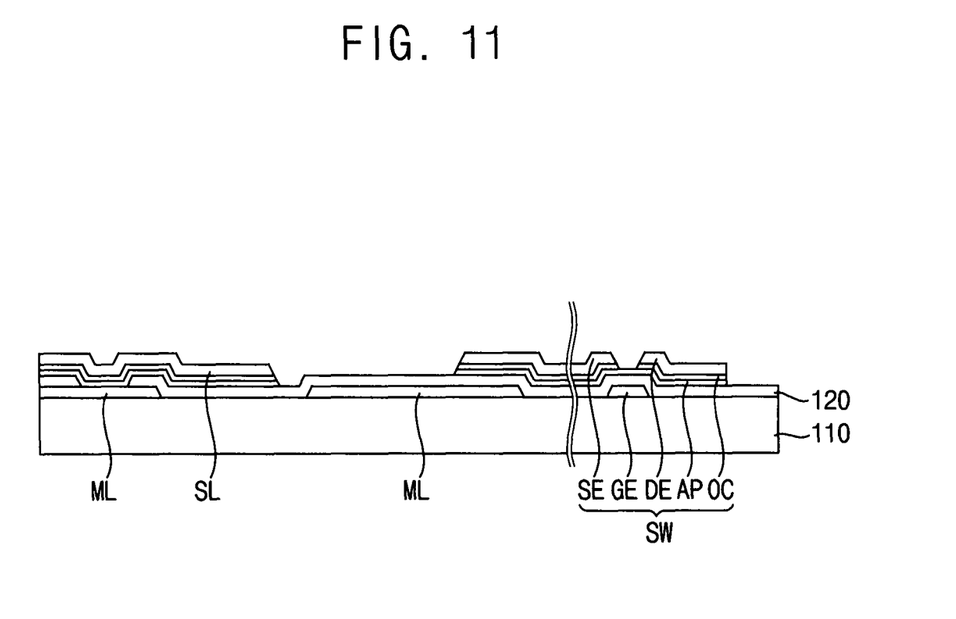

Referring to FIG. 11 taken along line I-I' of FIG. 2, the source electrode SE, the drain electrode DE and the sub-test-line SL are formed by patterning the second conductive layer 125. The patterned data metal layer 125a may be the source electrode SE and the drain electrode DE in the display area DA. The patterned data metal layer 125a may be the sub-test-line SL in the peripheral area PA.

The semiconductor layer AP and the ohmic contact layer OC are further formed by patterning the second conductive layer 125. The semiconductor layer AP may include amorphous silicon (a-Si:H). The ohmic contact layer OC may be interposed between the semiconductor layer AP and the source electrode SE, and may be interposed between the semiconductor layer AP and the drain electrode DE. The ohmic contact layer OC may include n+ amorphous silicon (n+ a-Si:H).

After a data line DL, the source electrode SE and the drain electrode DE are formed, an open state and a shorted state of the data line DL may be tested. A test of an open and a shorted state of the data line DL may include one method in which a contact is applied to a test line and another method in which a contact is not applied to a test line. As used herein, a contact indicates a physical contact to the test line. A method in which a contact is applied to a test line may damage or impair the test line, but a method in which a contact is applied to the test line may be accurate. However, a method in which a contact is not applied to a test line may not damage or impair a test line, but a method in which a contact is not applied to the test line may be inaccurate.

One or more exemplary embodiment of the display substrate 100 according to the invention includes a test line formed in a multi-layer structure, such as including a double layer structure. The test line includes a main-test-line ML and a sub-test-line SL in different layers of the display substrate 100 than each other and in electrical connection with each other. When a test is performed by contacting the test line, the sub-test-line SL is contacted with a tester. Thus, the sub-test-line SL may be damaged by the contacting of the tester. However, the main-test-line ML is not contacted with the tester, so that the main-test-line ML is not damaged. Thus, an accurate test may be performed without damage of the test line.

Figure 12:
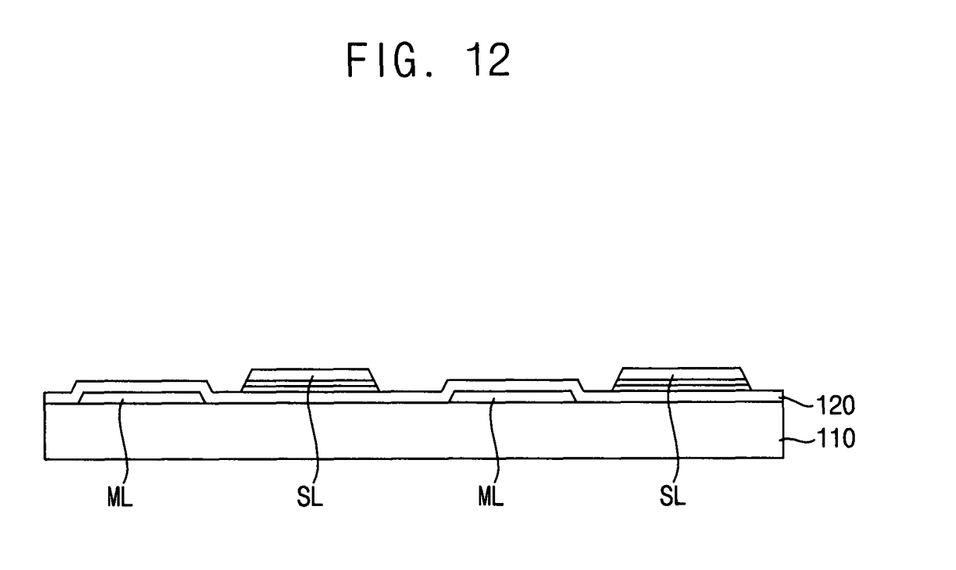

Referring to FIG. 12 taken along line II-II' of FIG. 2, the sub-test-line SL is formed by patterning the second conductive layer 125. A plurality of sub-test-lines SL may be formed on the base substrate 110. The sub-test-lines SL may be extended parallel to each other. The patterned data metal layer 125a may be the sub-test-line SL in the peripheral area PA. The sub-test-line SL may be disposed over the main-test-line ML to overlap the main-test-line ML in the plan view. The sub-test-line SL may be insulated from the main-test-line ML by the gate insulation layer 120. The sub-test-line SL may be formed from a same layer and in a same layer of the display substrate as the source electrode SE and the drain electrode DE. In addition, the sub-test-line SL may include the same material as the source electrode SE and the drain electrode DE.

Figure 13:
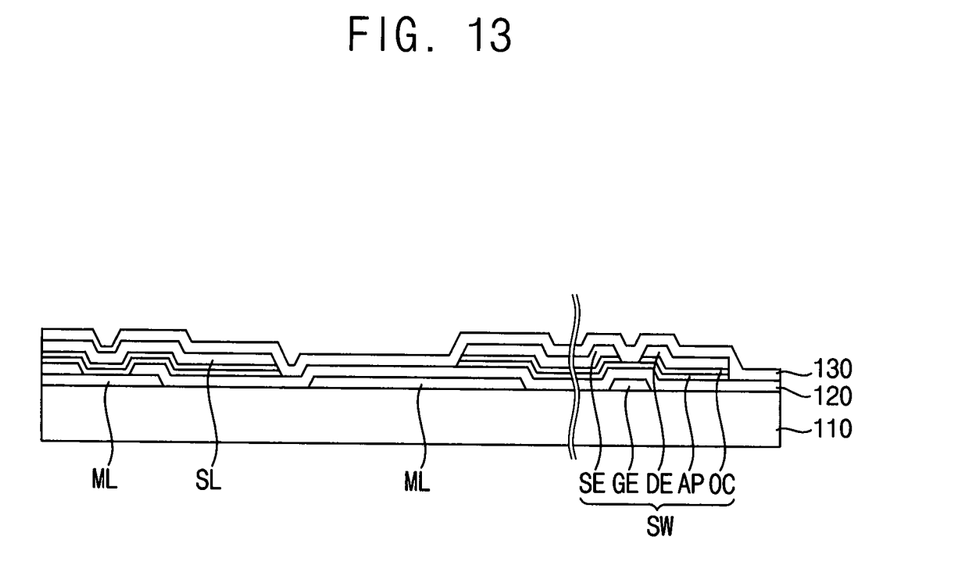

Referring to FIG. 13 taken along line I-I' of FIG. 2, a first passivation layer 130 may be formed on the base substrate 110 including the source electrode SE, the drain electrode DE and the sub-test-line SL thereon. The first passivation layer 130 may include the same material as the gate insulation layer 120. In an exemplary embodiment, for example, the first passivation layer 130 may include an inorganic material such as silicon oxide (SiOx) and/or silicon nitride (SiNx).

Figure 14:
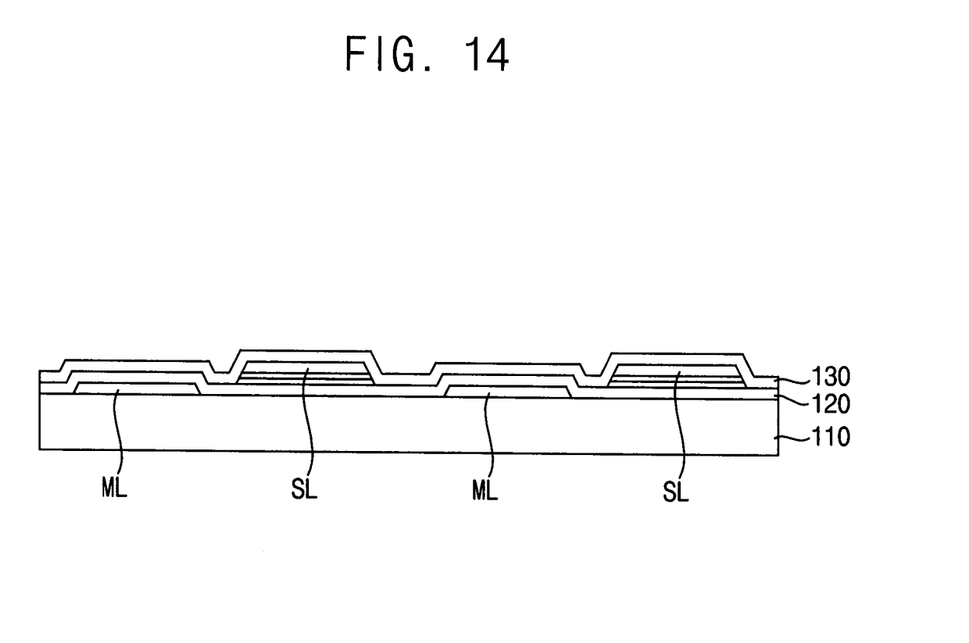

Referring to FIG. 14 taken along line II-II' of FIG. 2, the first passivation layer 130 may be formed on the base substrate 110 including the sub-test-line SL thereon. A plurality of sub-test-lines SL may be formed on the base substrate 110. The sub-test-lines SL may be extended parallel to each other. The first passivation layer 130 may include the same material as the gate insulation layer 120. In an exemplary embodiment, for example, the first passivation layer 130 may include an inorganic material such as silicon oxide (SiOx) and/or silicon nitride (SiNx).

Figure 15:
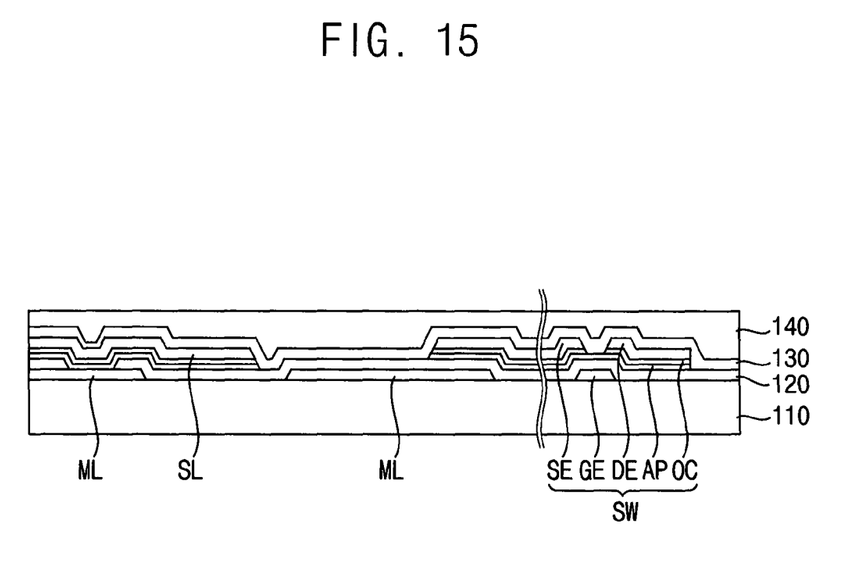

Referring to FIG. 15 taken along I-I' of FIG. 2, an organic layer 140 is formed on the base substrate 110 including the passivation layer 130 thereon. The organic layer 140 planarizes an upper surface of the display substrate 100 so that problems due to a step difference between layers of the display substrate, such as disconnection of a signal line, may be reduced or effectively prevented. The organic layer 140 may be an insulation layer including an organic material.

Figure 16:
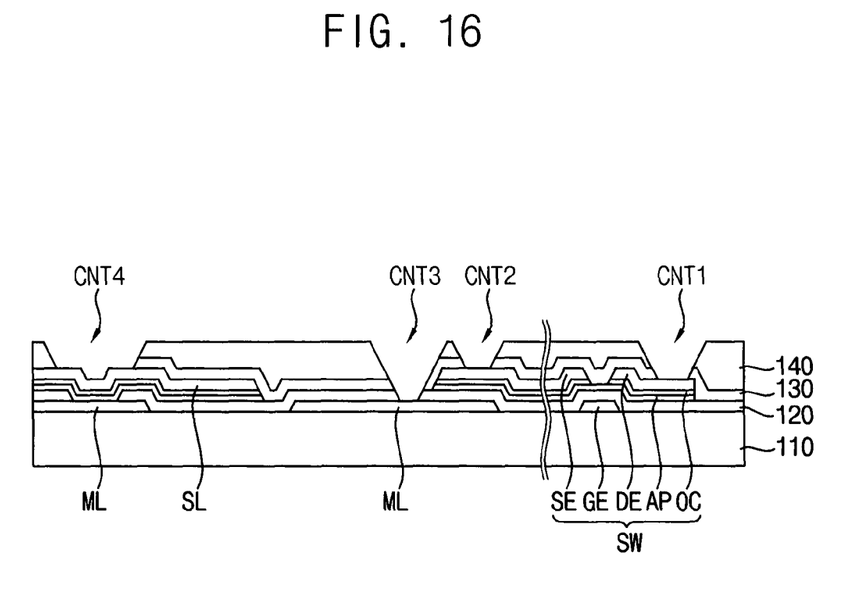

Referring to FIG. 16 taken along line I-I' of FIG. 2, the passivation layer 130 and the organic layer 140 are patterned. Accordingly, a portion of the drain electrode DE may be exposed in the display area DA. A portion of the main-test-line ML and a portion of the sub-test-line SL may be exposed in the peripheral area PA.

A first contact hole CNT1 is formed through cross-sectional thicknesses of the passivation layer 130 and the organic layer 140, so that the first contact hole CNT1 exposes a portion of the drain electrode DE. A second contact hole CNT2 is formed through cross-sectional thicknesses of the passivation layer 130 and the organic layer 140, so that the second contact hole CNT2 exposes a portion of the sub-test-line SL. A third contact hole CNT3 is formed through cross-sectional thicknesses of the gate insulation layer 120, the passivation layer 130 and the organic layer 140, so that the third contact hole CNT3 exposes a portion of the main-test-line ML. A fourth contact hole CNT4 is formed through the cross-sectional thicknesses of the passivation layer 130 and the organic layer 140, so that the fourth contact hole CNT4 exposes a portion of the sub-test-line SL.

Figure 17:
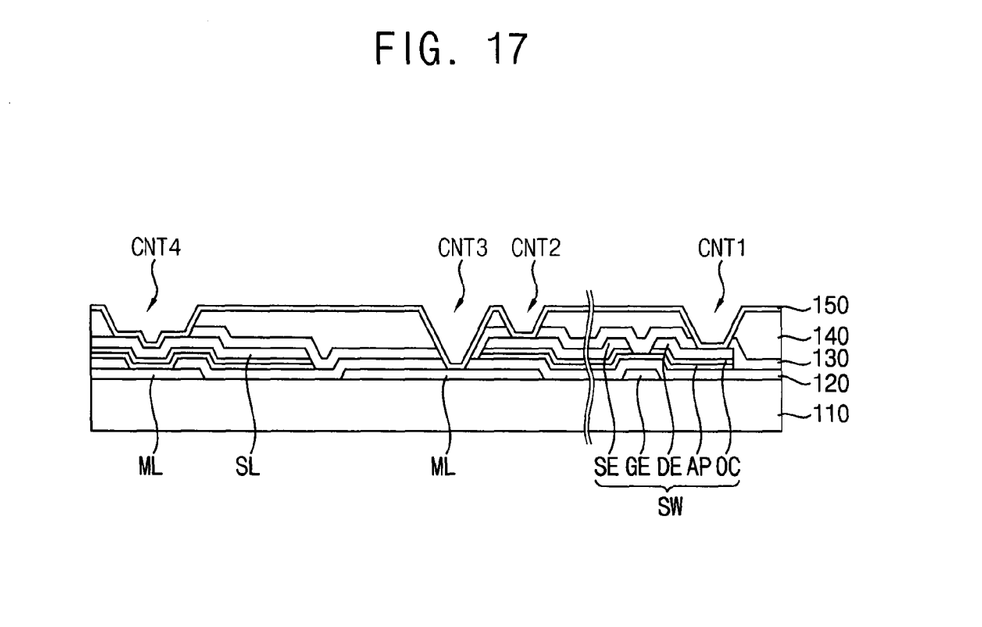

Referring to FIG. 17 taken along line I-I' of FIG. 2, a transparent conductive layer 150 is formed on the patterned organic layer 140. The transparent conductive layer 150 may include a transparent conductive material such as ITO and IZO. In addition, transparent conductive layer 150 may include titanium (Ti) and/or molybdenum titanium (MoTi).

Referring again to FIG. 3, a pixel electrode PE, a connecting electrode CE and a pad electrode TE are formed by patterning the transparent conductive layer 150.

The patterned transparent conductive layer 150 may be the pixel electrode PE in the display area DA. The pixel electrode PE may include a transparent conductive material, such as ITO, IZO, etc. In addition, the pixel electrode PE may include titanium (Ti) and/or molybdenum titanium (MoTi). The pixel electrode PE may be electrically connected with the drain electrode DE through the first contact hole CNT1.

The patterned transparent conductive layer 150 may be the connecting electrode CE and the pad electrode TE in the peripheral area PA. The connecting electrode CE may be electrically connected with the sub-test-line SL through the second contact hole CNT2. The connecting electrode CE may be electrically connected with the main-test-line ML through the third contact hole CNT3. Thus, connecting electrode CE may connect the main-test-line ML and the sub-test-line SL to each other through the second contact hole CNT2 and the third contact hole CNT3.

The connecting electrode CE may be formed from a same layer and be in a same layer of the display substrate as the pixel electrode PE. In addition, the connecting electrode CE may include a transparent conductive material such as ITO and IZO. In addition, the connecting electrode CE may include titanium (Ti) and/or molybdenum titanium (MoTi).

The pad electrode TE may be electrically connected with the sub-test-line SL through the fourth contact hole CNT4. The sub-test-line SL may be electrically connected with the main-test-line ML through the fifth contact hole CNT5 via the patterned second conductive layer 125. Thus, pad electrode TE may be electrically connected with both the main-test-line ML and the sub-test-line SL. A test signal may be applied to the test pad TP. Thus, an open state and a shorted state of the data line DL may be tested by using the test signal applied to the test pad TP.

The pad electrode TE may be formed from a same layer and in a same layer of the display substrate as the pixel electrode PE. In addition, the pad electrode TE may include a transparent conductive material such as ITO and IZO. In addition, pad electrode TE may include titanium (Ti) and/or molybdenum titanium (MoTi).

Figure 18:
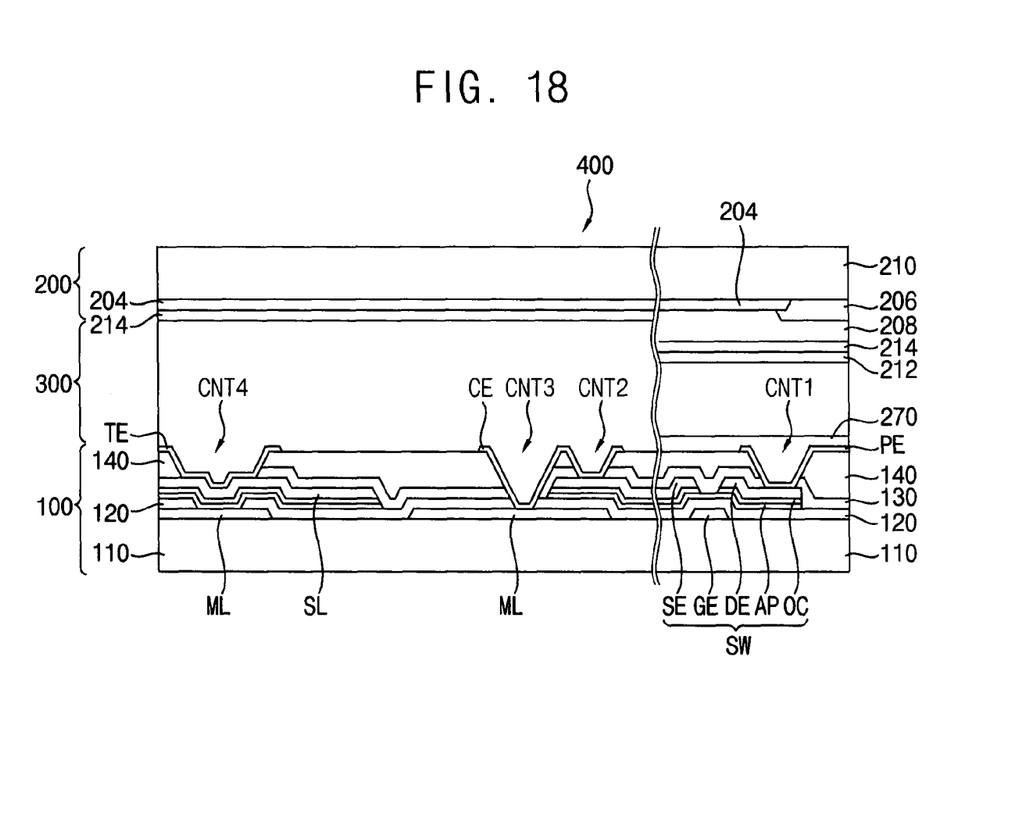
FIG. 18 is a cross-sectional view illustrating an exemplary embodiment of display apparatus according to the invention.

FIG. 18 is a cross-sectional view illustrating an exemplary embodiment of display apparatus according to the invention.

Referring to FIG. 18, a display apparatus 400 includes a lower substrate 100, an upper substrate 200 and a liquid crystal layer 300.

The lower substrate 100 includes a plurality of data lines DL, a plurality of gate lines GL, a plurality of switching elements SW and a plurality of pixel electrodes PE. The data lines DL are arranged in a first direction D1. The data line DL extends in a second direction D2 crossing the first direction D1. The gate lines GL are arranged in the second direction D2. The gate line GL extends in the first direction D1. Each of the switching elements SW is electrically connected to a gate line GL and a data line DL among the plurality of gate lines GL and data lines DL. Each of the pixel electrodes PE is electrically connected to a switching element SW among the plurality of switching elements SW. An addition, a first alignment layer 270 is formed on the pixel electrode PE. The first alignment layer 270 is formed on the pixel electrode PE to align a liquid crystal molecule of the liquid crystal layer 300.

The lower substrate 100 includes a test pad TP connected with a data line DL to test the data line DL and is disposed in the peripheral area PA. A test line connecting the data line DL and the test pad TP to each other is disposed in the peripheral area PA. The test line may include a main-test-line ML and a sub-test-line SL.

The upper substrate 200 includes a second base substrate 210, a black matrix 204, a color filter 206, an over-coating layer 208, a common electrode 214 and a second alignment layer 212. The black matrix 204 and the color filter 206 are disposed on the second base substrate 210. The over-coating layer 208 is disposed on the black matrix 204 and the color filter 206. The common electrode 214 is disposed on the over-coating layer 208. The second alignment layer 212 is disposed on the common electrode 214 to align a liquid crystal molecule of the liquid crystal layer 300.

The liquid crystal layer 300 is interposed between the lower substrate 100 and the upper substrate 200.

According to one or more exemplary embodiment of invention as explained above, the test line includes a main-test-line including a gate layer metal and a sub-test-line including a data layer metal. In addition, sub-test-line overlaps the main-test-line and is exposed to outside a display substrate in a manufacturing process. Thus, a defect of a data line may be tested by contacting the exposed sub-test-line.

In addition, a defect test is performed by contacting the exposed sub-test-line of the test line, so that an accurate result may be obtained. In addition, although the sub-test-line may be damaged by the contact thereto, the un-exposed main-test-line of the test line is not damaged. Thus, a quality of a display apparatus including the display substrate may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
    a base substrate comprising a display area, and a peripheral area surrounding the display area;
    a gate line extending in a first direction, and a data line extending in a second direction crossing the first direction;
    a switching element in the display area and electrically connected with the gate line and the data line;
    a main-test-line in the peripheral area, extending in the second direction and electrically connected with the data line;
    a sub-test-line in the peripheral area, electrically connected with the data line, and in a different layer from the main-test-line; and
    a test pad electrically in the peripheral area and connected with the main-test-line and the sub-test-line.

2. The display substrate of claim 1, wherein the main-test-line and the gate line are in a same layer.

3. The display substrate of claim 1, wherein the sub-test-line and the data line are in a same layer.

4. The display substrate of claim 1, wherein the sub-test-line overlaps the main-test-line.

5. The display substrate of claim 1, further comprising a connecting electrode connecting the main-test-line and the sub-test-line to each other.

6. The display substrate of claim 5, wherein the switching element comprises:
    a gate electrode electrically connected with the gate line;
    a source electrode electrically connected with the data line; and
    a drain electrode spaced apart from the source electrode.

7. The display substrate of claim 6, further comprising a pixel electrode electrically connected with the drain electrode,
    wherein the connecting electrode and the pixel electrode are in a same layer.

8. A display apparatus comprising:
    a first substrate comprising:
        a first base substrate comprising a display area, and a peripheral area surrounding the display area,
        a gate line extending in a first direction, and a data line extending in a second direction crossing the first direction,
        a switching element in the display area and electrically connected with the gate line and the data line,
        a main-test-line in the peripheral area, extending in the second direction and electrically connected with the data line,
        a sub-test-line in the peripheral area, electrically connected with the data line and in a different layer from the main-test-line, and
        a test pad in the peripheral area and electrically connected with the main-test-line and the sub-test-line; and
    a second substrate comprising:
        a second base substrate facing the first base substrate, and
        a common electrode on the second base substrate.

9. The display apparatus of claim 8, wherein the main-test-line and the gate line are in a same layer.

10. The display apparatus of claim 8, wherein the sub-test-line and the data line are in a same layer.

11. The display apparatus of claim 8, wherein the sub-test-line overlaps the main-test-line.

12. The display apparatus of claim 8, further comprising a connecting electrode connecting the main-test-line and the sub-test-line to each other.

13. The display apparatus of claim 12, further comprising a liquid crystal layer between the first substrate and the second substrate.

14. The display apparatus of claim 13, wherein the switching element comprises:
    a gate electrode electrically connected with the gate line;
    a source electrode electrically connected with the data line; and
    a drain electrode spaced apart from the source electrode.

15. The display apparatus of claim 14, further comprising a pixel electrode electrically connected with the drain electrode.

16. The display apparatus of claim 15, further comprising an alignment layer on the pixel electrode and configured to align a liquid crystal molecule of the liquid crystal layer.

17. The display apparatus of claim 15, wherein the pixel electrode comprises a transparent conductive material.

18. The display apparatus of claim 15, wherein the connecting electrode and the pixel electrode are in a same layer.

19. A method of manufacturing a display substrate, the method comprising:
    forming a first conductive layer on a base substrate;
    forming a gate metal pattern comprising a gate line and a main-test-line, by patterning the first conductive layer;
    forming a second conductive layer on the base substrate on which the gate metal pattern is formed; and
    forming a data metal pattern comprising a data line and a sub-test-line, by patterning the second conductive layer.

20. The method of claim 19, further comprising:
    forming a transparent conductive layer on the base substrate on which the data metal pattern is formed; and
    forming a connecting electrode connecting the main-test-line and the sub-test-line line to each other, by patterning the transparent conductive layer.

* * * * *